United States Patent
Huang

(10) Patent No.: US 6,211,068 B1
(45) Date of Patent: Apr. 3, 2001

(54) DUAL DAMASCENE PROCESS FOR MANUFACTURING INTERCONNECTS

(75) Inventor: Yimin Huang, Taichung Hsien (TW)

(73) Assignee: United Microelectronics Corp. (TW)

( * ) Notice: Subject to any disclaimer, the term of this patent is extended or adjusted under 35 U.S.C. 154(b) by 0 days.

(21) Appl. No.: 09/318,228

(22) Filed: May 25, 1999

(51) Int. Cl.$^7$ .................... H01L 21/4763; H01L 21/475; H01L 21/47; H01L 21/469
(52) U.S. Cl. .................... 438/634; 438/618; 438/622; 438/629; 438/636; 438/637; 438/638; 438/640; 257/750; 257/751; 257/752; 257/753; 257/758; 257/774
(58) Field of Search .................... 438/618, 622, 438/626, 627, 629, 634, 636, 637, 638, 643, 640; 257/750, 751, 752, 753, 758, 774

(56) References Cited

U.S. PATENT DOCUMENTS

| | | | | |
|---|---|---|---|---|
| 5,529,953 | * | 6/1996 | Shoda .................... | 438/644 |
| 5,689,140 | * | 11/1997 | Shoda .................... | 257/774 |
| 5,702,982 | * | 12/1997 | Lee et al. .................... | 438/620 |
| 5,726,100 | * | 3/1998 | Givens .................... | 438/702 |
| 5,877,076 | * | 3/1999 | Dai .................... | 438/597 |
| 5,882,996 | * | 3/1999 | Dai .................... | 438/597 |
| 5,969,422 | * | 10/1999 | Ting et al. .................... | 257/762 |
| 5,981,377 | * | 11/1999 | Koyama .................... | 438/633 |
| 6,008,119 | * | 12/1999 | Fournier .................... | 438/633 |
| 6,016,000 | * | 1/2000 | Moslehi .................... | 257/522 |
| 6,037,213 | * | 3/2000 | Shih et al. .................... | 438/253 |
| 6,042,999 | * | 3/2000 | Lin et al. .................... | 430/316 |
| 6,048,787 | * | 4/2000 | Lee .................... | 438/625 |

* cited by examiner

Primary Examiner—Steven Loke
Assistant Examiner—Bernard E. Souw
(74) Attorney, Agent, or Firm—Martine Penilla & Kim, LLP

(57) ABSTRACT

A dual damascene process for producing interconnects. The dual damascene process includes forming an etching stop layer over a substrate having a conductive layer therein, and forming an inter-layer dielectric layer over the etching stop layer. A mask layer is formed over the dielectric layer. The mask layer and the inter-layer dielectric layer are patterned to form an opening that expose a portion of the etching stop layer. The opening is formed above the conductive layer. Photoresist material is deposited over the mask layer and into the opening. The photoresist layer and the mask layer are patterned, and the photoresist material inside the opening is turned into a photoresist plug at the same time. A top layer of the photoresist plug is removed. Using the patterned photoresist layer and the mask layer as a mask, an anisotropic etching step is carried out to form a plurality of trenches inside the inter-layer dielectric layer. These trenches overlap with the opening. Metal is finally deposited into the opening and the trenches to complete the dual damascene process.

17 Claims, 5 Drawing Sheets

DUAL DAMASCENE PROCESS FOR MANUFACTURING INTERCONNECTS

BACKGROUND OF THE INVENTION

1. Field of Invention

The present invention relates to a method for manufacturing interconnects. More particularly, the present invention relates to a method for manufacturing interconnects using a dual damascene process.

2. Description of Related Art

In the fabrication of very large scale integrated (VLSI) circuits, semiconductor devices are generally linked by several metallic interconnecting layers commonly referred to as multilevel interconnects. As the level of circuit integration continues to increase, manufacturing processes are complicated and product yield and reliability is harder to maintain. Dual damascene process is a convenient method for forming multilevel interconnects. Principally, the process includes etching a dielectric layer to form trenches, and then depositing metal into the trenches to form the interconnects. The dual damascene process is capable of producing highly reliable interconnects with a relatively high product yield. Due to its versatility, the dual damascene process has become a predominant method for fabricating interconnects. However, several drawbacks in the method still need to be resolved. For example, photoresist (PR) that remains inside a via hole after a photolithographic operation may affect the profile of the via hole.

FIGS. 1A through 1C are schematic, cross-sectional views showing the steps taken in carrying out a conventional dual damascene process for fabricating interconnects. As shown in FIG. 1A, a semiconductor substrate 100 having a metallic layer 102 therein is provided. A silicon nitride layer 104 having a thickness of about 500 Å to 1000 Å is formed over the substrate 100. An inter-layer dielectric layer 106 having a thickness of about 9000 Å to 16000 Å is formed over the silicon nitride layer 104. A patterned photoresist layer 108 is formed over the inter-layer dielectric layer 106 using photolithographic techniques. Using the patterned photoresist layer 108 as a mask, the dielectric layer 106 is etched to form a via hole 110.

As shown in FIG. 1B, the photoresist layer 108 is removed. Meanwhile, another photoresist layer 112 to define the metal trench is formed over the inter-layer dielectric 106. Some of the photoresist material is also deposited into the via hole 110. The photoresist layer 112 is patterned by removing some photoresist material. However, some photoresist material inside the via hole 110 remains and forms a residual photoresist layer 112a.

As shown in FIG. 1C, using the photoresist layer 112 as a mask, an anisotropic etching operation is conducted to form trenches 114 inside the inter-layer dielectric 106. Subsequent processing steps are not shown in the figure because those steps should be familiar to the people in the semiconductor field. In brief, subsequent steps includes the removal of the photoresist layer 112, deposition to form a barrier layer and a copper layer and a final planarization using a chemical-mechanical polishing (CMP) method.

As shown in FIG. 1C, due to the difficulties in removing away some of the dielectric material in the neighborhood of the residual photoresist 112a, an undesirable trench profile is often created. In addition, the dielectric layer 106 is typically a silicon dioxide layer, which is a transparent material. Therefore, an anti-reflection coating is frequently required. However, the formation of the silicon nitride layer 104 as an anti-reflection coating between the metallic layer 102 and the dielectric layer 106 is far from ideal.

SUMMARY OF THE INVENTION

The invention provides a method of forming a dual damascene structure including the formation of a silicon oxynitride layer over an inter-layer dielectric layer that acts as an anti-reflection coating. The additional anti-reflection coating is able to improve the resulting trench profile after the trench-etching step. Furthermore, a portion of the photoresist material inside via holes is removed before carrying out the trench-forming etching operation. Hence, the photoresist layer inside the via hole no longer impedes the etching of dielectric material around the via hole/contact opening areas as in a conventional dual damascene process.

The invention provides a dual damascene process for producing interconnects. The dual damascene process includes forming an etching stop layer over a substrate having a conductive layer therein, and forming an inter-layer dielectric layer over the etching stop layer. A mask layer is formed over the dielectric layer. The mask layer and the inter-layer dielectric layer are patterned to form an opening that exposes a portion of the etching stop layer. The opening is formed above the conductive layer. Photoresist material is deposited over the mask layer and into the opening. The photoresist layer and the mask layer are patterned. After patterning, some of the photoresist may remain in the opening and form a photoresist plug at the same time. A top layer of the photoresist plug is removed. Using the patterned photoresist layer and the mask layer as a mask, an anisotropic etching step is carried out to form a plurality of trenches inside the inter-layer dielectric layer. These trenches overlap with the opening. Metal is finally deposited into the opening and the trenches to complete the dual damascene process.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
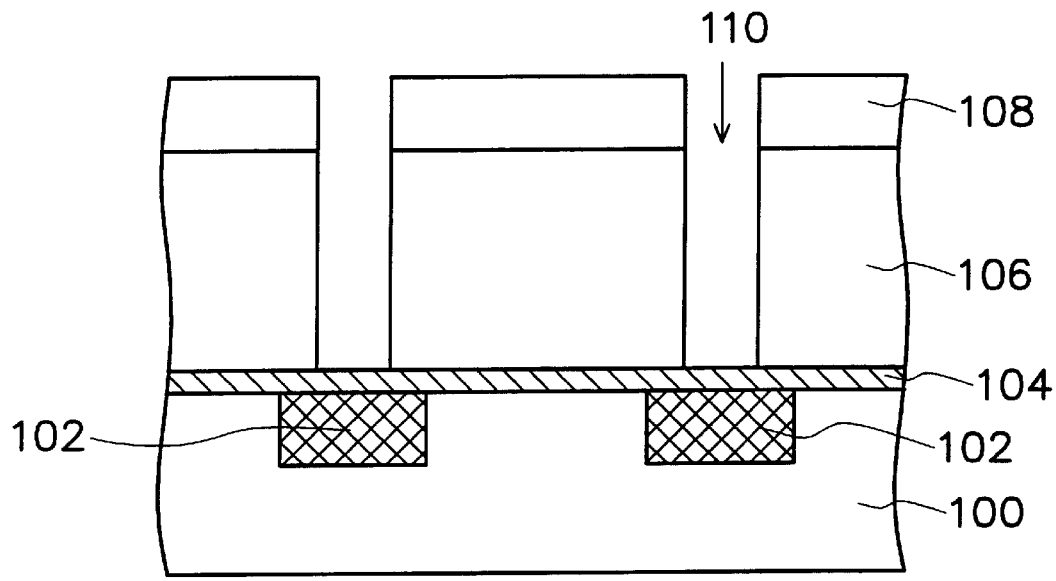
FIGS. 1A through 1C are schematic, cross-sectional views showing the steps taken in carrying out a conventional dual damascene process for fabricating interconnects.
Figure 1B:
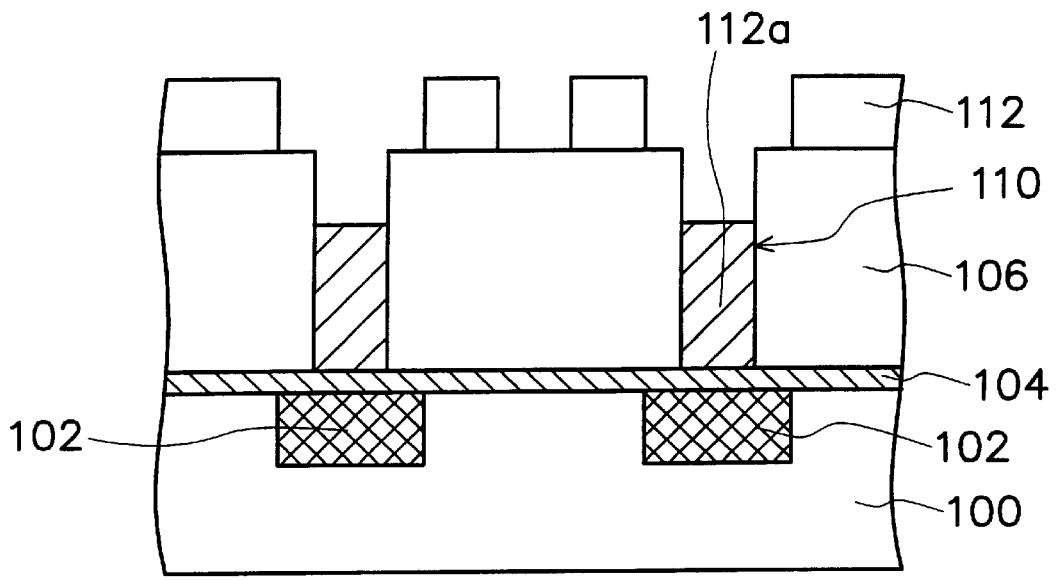
Figure 1C:
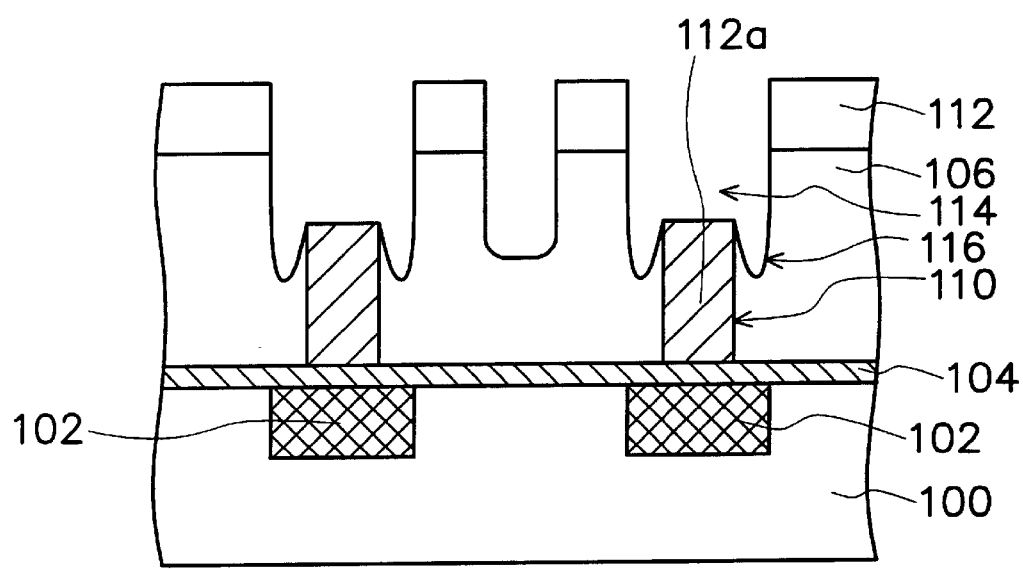

Reference will now be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing the steps for forming interconnects using a dual damascene process according to one preferred embodiment of this invention.

Figure 2A:
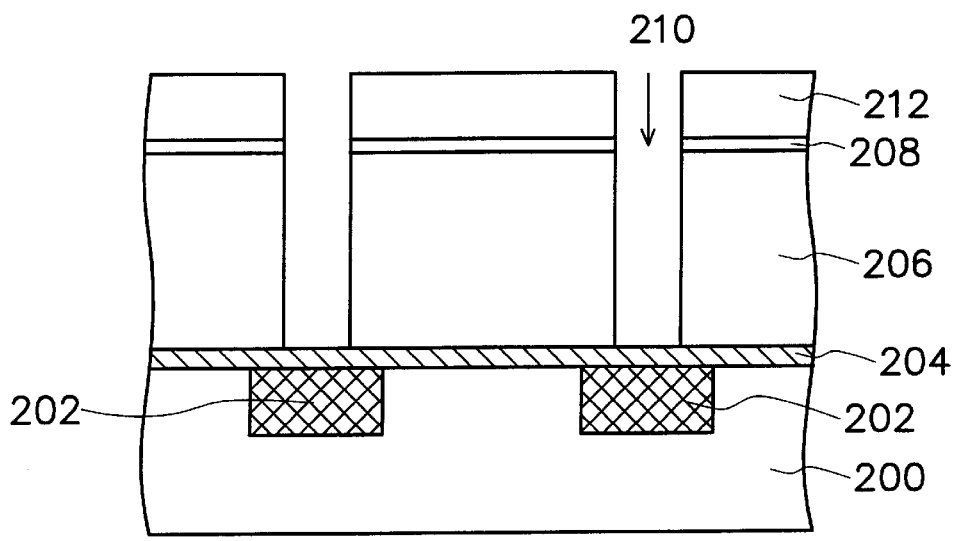
FIGS. 2A through 2E are schematic, cross-sectional views showing the steps for forming interconnects using a dual damascene process according to one preferred embodiment of this invention.

As shown in FIG. 2A, a semiconductor substrate 200 having a conductive layer 202 such as a word line, a bit line or a metallic line therein is provided. An etching stop layer 204 is formed over the conductive layer 202 and the substrate 200 using, for example, a chemical vapor deposition (CVD) method. The etching stop layer 204 is preferably a silicon nitride layer having a thickness of between about 500 Å and 1000 Å. An inter-layer dielectric layer 206 is formed over the etching stop layer 204 again using, for example, a CVD method. The dielectric layer 206 is preferably a silicon dioxide layer having a thickness of between about 9000 Å and 16000 Å.

A mask layer 208 is formed over the dielectric layer 206. The mask layer 208 can be, for example, either a silicon nitride or a silicon oxynitride layer, but is preferably a silicon oxynitride layer. Typically, the mask layer 208 preferably having a thickness of between about 400 Å and 1000 Å is formed using, for example, a chemical vapor deposition (CVD) method. The dielectric layer 206 and the mask layer 208 are patterned to form an opening 210 such as a via opening or a contact opening. For example, conventional photolithographic and etching processes are used to form a patterned photoresist layer 212 above the mask layer 208. Using the patterned photoresist layer 212 as a mask, an anisotropic etching step is carried out to form the opening 210 that exposes a portion of the etching stop layer 204. After that, the photoresist layer 212 is removed.

Figure 2B:
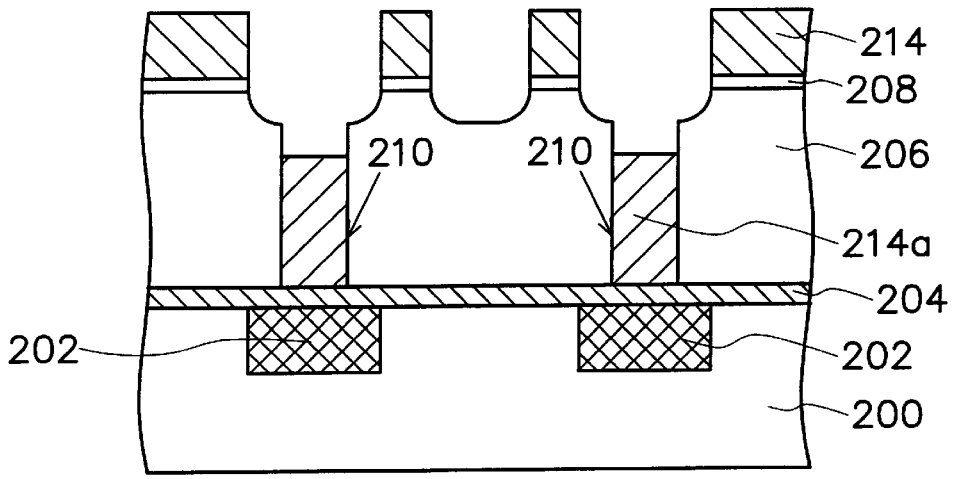

As shown in FIG. 2B, another photoresist layer 214 is formed over the mask layer 208. Some of the photoresist material is also deposited into the opening 210. The photoresist layer 214 is patterned. For example, conventional photolithographic and etching processes are used to transfer the pattern of a second interconnect layer onto the photoresist layer 214. Meanwhile, some of the photoresist material inside the opening 210 is turned into a photoresist plug 214a. A top surface of photoresist plug 214a is lower than a top surface of the via/contact opening 210. The mask layer 208 is also patterned by transferring the pattern on the photoresist layer 214 to the mask layer 208. For example, the patterned photoresist layer 214 is used as a mask in an anisotropic etching step so that portions of the mask layer 208 not covered by the photoresist layer 214 are removed. During the etching step, a portion of the dielectric layer 206 is also removed, forming a schematic, cross-sectional profile similar to FIG. 2B.

Figure 2C:
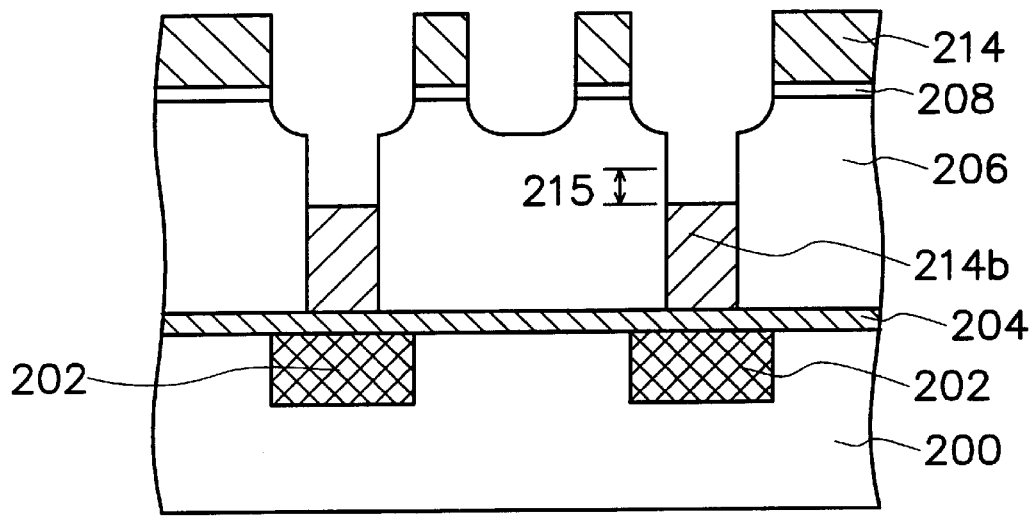

As shown in FIG. 2C, a top layer having a thickness 215 is removed from the photoresist plug 214a to form a shorter photoresist plug 214b. Photoresist plug material can be removed by performing, for example, a dry etching operation using oxygen plasma. Note that a top layer is also removed from the photoresist layer 214 when the plug 214b is etched so that the photoresist layer 214 is thereafter thinner thereafter.

Figure 2D:
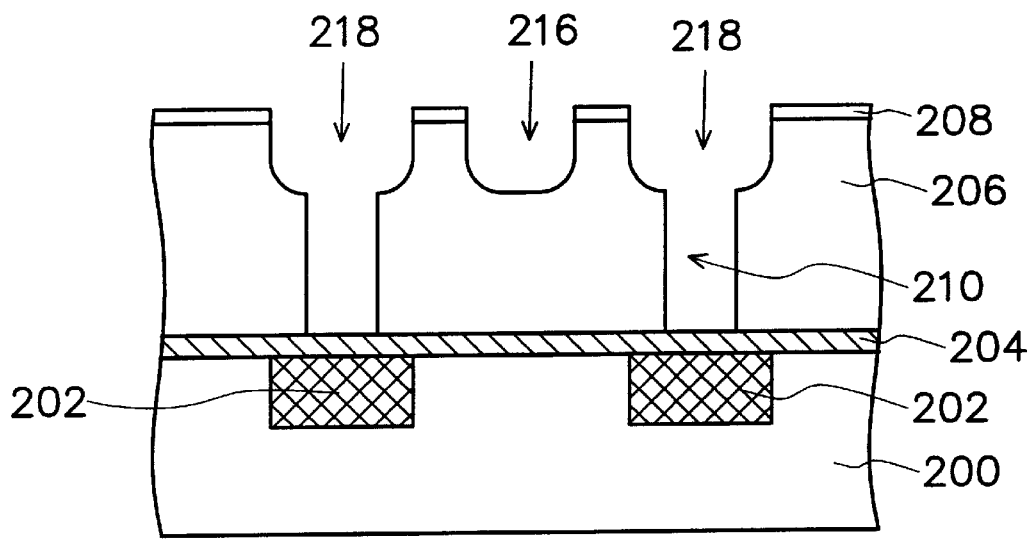

As shown in FIG. 2D, using the photoresist layer 214 and the mask 208 as a mask, a portion of the inter-layer dielectric layer 206 is removed to form trenches 216 and 218. An anisotropic etching operation, for example, can be used to remove dielectric material from the dielectric layer 206. The trenches 218 overlap with the via/contact openings 210. Since a top layer of the photoresist plug 214a is removed prior to the etching step, height level of the photoresist plug 214a no longer affects the ultimate schematic, cross-sectional profile of the trenches. In other words, the trenches not deep enough to make any contact with the upper portion of the photoresist plug 214b.

In addition, due to the presence of the mask layer 208, the dielectric layer 206 under the mask layer 208 is not affected by the etching step even though the photoresist layer 214 is already quite thin. Thereafter, the remaining photoresist layer 214b is removed.

Figure 2E:
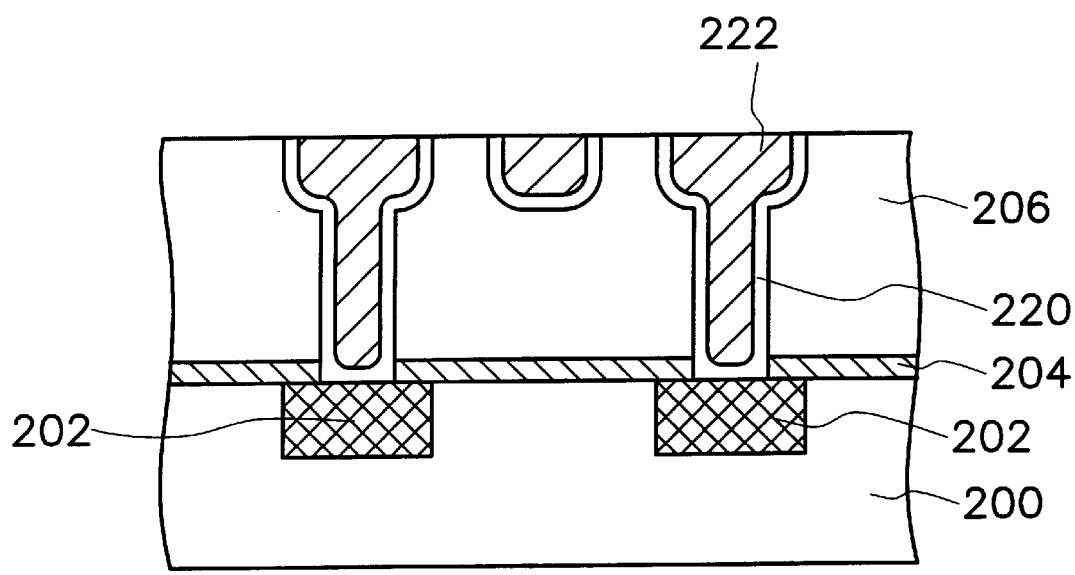

Subsequent processing steps include the removal of the portions of the etching stop layer in the opening, the removal of the mask layer, the formation of a barrier layer 220 over the via/contact opening 210 and the deposition of a metallic layer 222 above the barrier layer 220. Finally, a chemical-mechanical polishing (CMP) operation is performed to remove a portion of the metallic layer 222 and the barrier layer to form a structure as shown in FIG. 2E. Since these steps are not directly related to the invention, detailed description is omitted.

In summary, one major aspect of the invention is the formation of a silicon oxynitride layer above the inter-metal dielectric layer. The silicon oxynitride layer not only serves as a mask, but also functions as an anti-reflection coating. A second aspect of the invention is the removal of some photoresist material from the top of the photoresist plug before a trench-forming etching step is conducted. Hence, an integral trench profile can be obtained.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A dual damascene process, comprising the steps of:
   providing a substrate having a conductive layer therein;
   forming an etching stop layer over the substrate and the conductive layer;
   forming an inter-layer dielectric layer over the etching stop layer;
   forming a mask layer over the inter-layer dielectric layer;
   patterning the mask layer and the inter-layer dielectric layer to form an opening that exposes a portion of the etching stop layer inside the inter-layer dielectric layer such that the opening is located directly above the conductive layer;
   depositing photoresist material on the mask layer and into the opening;
   patterning the photoresist layer and the mask layer such that the photoresist material inside the opening forms a photoresist plug;
   performing a removing operation to remove a top layer of the photoresist plug;
   performing an anisotropic etching operation with the patterned photoresist layer and the mask layer serving as a mask so as to form a plurality of trenches in the inter-layer dielectric layer such that the trenches overlap with the opening;
   removing substantially the entirety of the remaining photoresist layer;
   removing the etching stop layer exposed in the opening and the mask layer; and
   depositing metal into the trenches and the opening.

2. The process of claim 1, wherein the step of forming the mask layer includes depositing silicon oxynitride.

3. The process of claim 1, wherein the silicon oxynitride layer has a thickness of between about 400 Å and 1000 Å.

4. The process of claim 1, wherein the step of forming an opening includes producing a via hole.

5. The process of claim 1, wherein the step of forming an opening includes producing a contact opening.

6. The process of claim 1, wherein the step of patterning the photoresist layer and the mask layer further includes removing a portion of the inter-layer dielectric layer.

7. The process of claim 1, wherein the step of forming the inter-layer dielectric layer includes depositing silicon dioxide to a thickness of between about 9000 Å and 16000 Å.

8. The process of claim 1, wherein after the step of removing a top layer of the photoresist plug, the top surface of the residual photoresist plug still remains below the bottom of the trench.

9. The process of claim 1, wherein the conductive layer includes a metallic layer.

10. A dual damascene process for forming interconnects above a semiconductor substrate having a conductive layer therein, and an etching stop layer and an inter-layer dielectric layer thereon, comprising the steps of:

forming a mask layer over the inter-layer dielectric layer;

forming an opening that exposes a portion of the etching stop layer in the inter-layer dielectric layer and the mask layer such that the opening is located above the conductive layer;

depositing photoresist material on the mask layer and into the opening;

patterning the photoresist layer and the mask layer such that the photoresist material inside the opening forms a photoresist plug;

performing a removing operation to remove a portion of the photoresist layer as well as a top layer of the photoresist plug;

removing a portion of the inter-layer dielectric layer with the patterned photoresist layer and the mask layer serving as a mask to form a plurality of trenches that overlap with the opening;

removing substantially the entirety of the remaining photoresist layer;

removing the etching stop layer exposed in the opening and the mask layer; and depositing metal into the trenches and the opening.

11. The process of claim 10, wherein the step of forming the mask layer includes depositing silicon oxynitride.

12. The process of claim 10, wherein the silicon oxynitride layer has a thickness of between about 400 Å and 1000 Å.

13. The process of claim 10, wherein the step of forming an opening includes producing a via hole.

14. The process of claim 10, wherein the step of forming an opening includes producing a contact opening.

15. The process of claim 10, wherein the step of patterning the photoresist layer and the mask layer further includes removing a portion of the inter-layer dielectric layer.

16. The process of claim 10, wherein the step of forming the inter-layer dielectric layer includes depositing silicon dioxide to a thickness of between about 9000 Å and 16000 Å.

17. The process of claim 10, wherein after the step of removing a top layer of the photoresist plug, the top surface of the residual photoresist plug still remains below the bottom of the trench.

* * * * *